United States Patent [19]

Kley

[11] Patent Number: 5,620,814
[45] Date of Patent: Apr. 15, 1997

[54] PROCESS AND ARRANGEMENT FOR PRODUCING DOSE PROFILES FOR THE FABRICATION OF STRUCTURED SURFACES

[75] Inventor: Ernst-Bernhard Kley, Jena, Germany

[73] Assignee: Leica Lithographie Systeme Jena GmbH, Jena, Germany

[21] Appl. No.: 446,607

[22] PCT Filed: Oct. 6, 1994

[86] PCT No.: PCT/EP94/03306

§ 371 Date: May 26, 1995

§ 102(e) Date: May 26, 1995

[87] PCT Pub. No.: WO95/10799

PCT Pub. Date: Apr. 20, 1995

[30] Foreign Application Priority Data

Oct. 15, 1993 [DE] Germany ............... 43 33 620.5

[51] Int. Cl.$^6$ ................................................. G03F 9/00
[52] U.S. Cl. ................... 430/5; 430/22; 430/296; 430/397; 156/150; 156/272.2
[58] Field of Search ...................... 430/522, 296, 430/397; 156/150, 272.2, 272.5

[56] References Cited

U.S. PATENT DOCUMENTS

| | | | |
|---|---|---|---|
| 3,893,856 | 7/1975 | Bestenreinerm et al. | 430/321 |
| 4,609,259 | 9/1986 | Suemitsu et al. | 350/417 |
| 4,935,334 | 6/1990 | Boettiger et al. | 430/327 |
| 5,082,755 | 1/1992 | Liu | 430/5 |
| 5,082,762 | 1/1992 | Takahashi | 430/296 |
| 5,304,441 | 4/1994 | Samuels et al. | 430/30 |

FOREIGN PATENT DOCUMENTS

| | | |
|---|---|---|
| 0338110 | 10/1989 | European Pat. Off. . |
| 7114064 | 12/1972 | France . |
| 1497404 | 8/1969 | Germany . |
| WO94/25881 | 11/1994 | WIPO . |

OTHER PUBLICATIONS

Patent Abstract of Japan, vol. 7, No. 292 (E–219) (1437) 27 Dec. 1983, (JP, A, 58–166723 [Hitachi Seisakusho K.K.]).

*Primary Examiner*—S. Rosasco
*Attorney, Agent, or Firm*—McAulay Fisher Nissen Goldberg & Kiel, LLP

[57] ABSTRACT

The object of a process and an arrangement for producing dose profiles for the fabrication of structured surfaces with a beam which is used for exposure and is directed on the surface consists in arranging the surface irradiation in such a way that the processing times and material outlay required for fabrication of micro-lenses and micro-lens arrays can be substantially reduced. According to the invention, the beam has at least one shaped region in cross section, which shaped region is movable relative to the surface and whose extent in the movement direction of the relative movement, in combination with the velocity of the relative movement, determines the dose. Effective lithographic fabrication of lens structures, in particular micro-lenses and micro-lens arrays, can be realized with the invention.

14 Claims, 14 Drawing Sheets

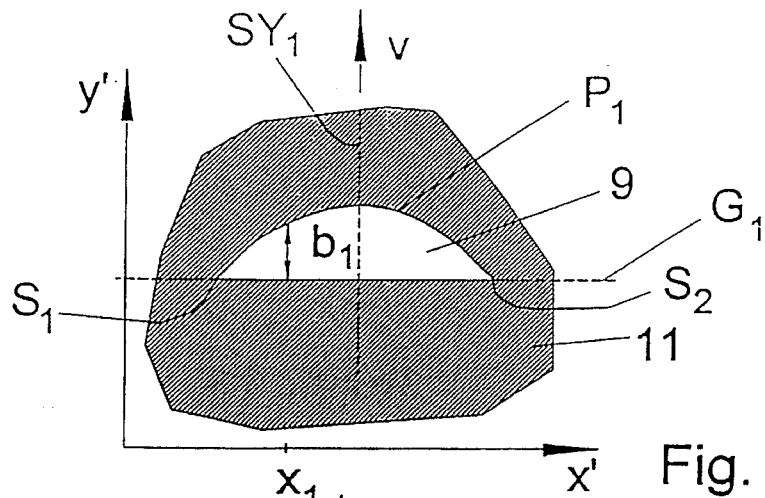
Fig. 3a
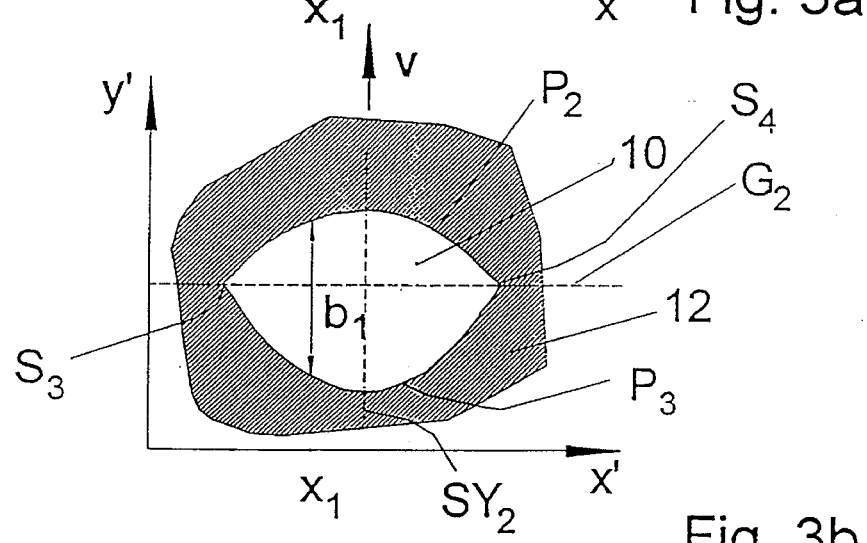
Fig. 3b
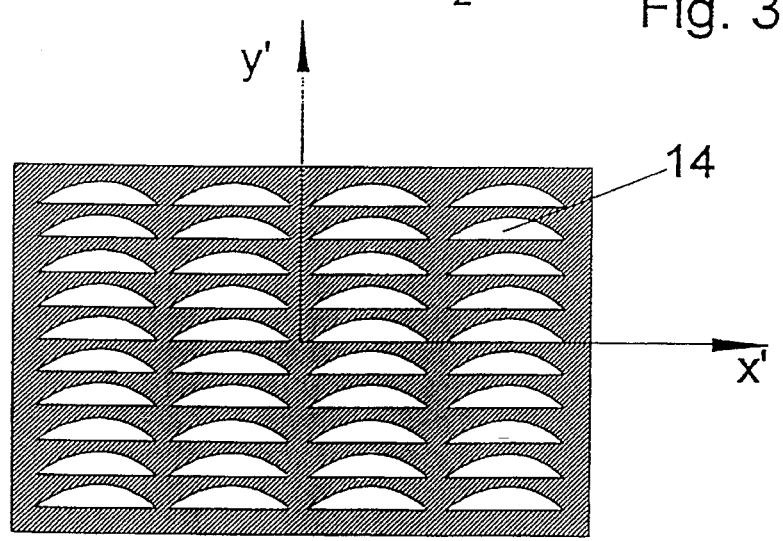
Fig. 3c
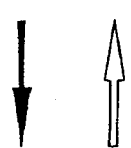

PROCESS AND ARRANGEMENT FOR PRODUCING DOSE PROFILES FOR THE FABRICATION OF STRUCTURED SURFACES

BACKGROUND OF THE INVENTION a) Field of the Invention

The invention is directed to a process and an arrangement for producing dose profiles for the fabrication of structured surfaces with a beam which is used for exposure and is directed on the surface.

b) Description of the Related Art

Devices and processes employing the technique of variable dose writing to fabricate surface profiles for electron-beam lithography and photolithography are known (T. Fujita, H. Nishihara, J. Kayama, "Blazed grating and Fresnel lenses fabricated by electron-beam lithography", *Opt. Lett.* 7 (1982) 12, p. 578; M. Haruna, M. Takahishi, K. Wakahayhashi, H. Nishihara, "Laser beam lithographed Micro-Fresnel lenses", *Applied Optics*/Vol. 29, No. 34/1 December 1990).

The fact that the dissolve rate of a radiation-sensitive resist in the developer bath can be predetermined by the radiation dose introduced in the resist is made use of. Accordingly, it is possible to design the lateral radiation dose distribution in such a way that the desired surface profile is obtained after a certain period of time following development. FIG. 14 illustrates this procedure schematically.

However, the high cost of the facilities for producing the dose profiles required for this process poses problems, since the systems which have been used up to now, such as electron-beam writing devices or laser pattern generators, are physically large and very expensive. Further, very long processing times are necessary for extended surface profiles. The fabrication of micro-lenses and micro-lens arrays especially is highly time-consuming. Further, the amounts of data needed to write the required dose profiles are sometimes enormous, requiring a corresponding expenditure on computer technology.

OBJECT AND SUMMARY OF THE INVENTION

It is the object of the primary present invention to arrange the surface irradiation in such a way that the processing times and material outlay required for fabrication of micro-lenses and micro-lens arrays can be substantially reduced.

This object is met, according to the invention, by a process for producing dose profiles for the fabrication of structured surfaces with a beam used for exposure and directed on the surface, in that the beam has at least one shaped region in cross section, which shaped region is movable relative to the surface and whose extent in the movement direction of the relative movement, in combination with the velocity of the relative movement, determines the dose.

The relative movement is effected in at least one of two directions which are inclined at an angle relative to one another. The angle is advisably 90°, but may also diverge from 90°.

Parallel adjacent exposures are produced in the direction of relative movement for fabricating the lens array. It is also possible to use a rotating movement as relative movement.

Further, the subject of the invention is an optical arrangement for producing dose profiles for the fabrication of structured surfaces with a beam used for exposure and directed on the surface, in which a device is provided for shaping the cross section of the beam, which device generates at least one shaped region which is movable relative to the surface and whose extent in the direction of the relative movement, in combination with the velocity of the relative movement, determines the dose.

The device for shaping the cross section of the beam is advantageously a diaphragm whose aperture in the movement direction, in combination with the velocity of the relative movement, determines the dose.

The diaphragm can be a multiple diaphragm in which the individual diaphragms are arranged one behind the other in the movement direction, and the aperture of each individual diaphragm in the direction of relative movement determines the dose in combination with the velocity of the relative movement.

Piezo-actuators can be connected with the multiple diaphragm to produce the relative movement which substantially corresponds to the distance between the individual diaphragms in the movement direction.

The diaphragm aperture advantageously has a rim formed of a straight line and a parabola, wherein the parabola, whose axis of symmetry is directed in the movement direction, connects two points on the straight line normal to the movement direction.

Dose profiles suitable for fabricating concave Fresnel structures can be produced when at least one rectangular shadow element is placed in a diaphragm aperture having such a rim, one side of the rectangular shadow element coinciding with the straight line and the opposite side contacting the parabola by its end points. In the regions left open by the shadow element the edges normal to the movement direction are advantageously situated at a common border.

The diaphragm aperture can also have a rim formed of two parabolas, wherein the parabolas, which have a common axis of symmetry oriented in the movement direction, are constructed so as to be convex in the movement direction and in the opposite direction and have common intersection points lying on a straight line normal to the movement direction.

Diaphragms whose aperture is a portion within a rectangular rim left open by a shadow element are used for producing convex structures, wherein a pair of rim sides has sides extending in a direction normal to the movement direction.

Convex cylindrical lenses are formed by dose profiles produced by a diaphragm aperture in which one of the sides normal to the movement direction coincides with a straight edge of the shadow element, whose other edge is a parabola whose axis of symmetry in the movement direction connects two points on the straight edge.

For convex Fresnel lenses, the shadow element should be formed of partial elements remaining after at least one rectangular portion is removed from a surface enclosed by a straight line and a parabola, wherein the parabola, whose axis of symmetry is oriented in the movement direction, connects two points on the straight line normal to the movement direction. One side of the rectangular portion coincides with the straight line, while the end points of the opposite side contact the parabola.

Finally, the partial elements are so disposed that their straight edges normal to the movement direction are located at one of the sides of the rectangular rim which are normal to the movement direction.

Diaphragms having an aperture corresponding to a fight triangle, one of whose legs is directed in the movement direction, may also be used. It is also possible to use an aperture shaped like an isosceles triangle whose vertex formed by the equal sides is directed in the movement direction.

Adjusting slides are advantageously provided for adjusting the shape or magnitude of the diaphragm.

A display screen which directly projects the shaped region can also be used for shaping the cross section of the beam. The shape of the region generated by the display screen corresponds to the shapes generated by the diaphragms.

The invention is explained more fully in the following with reference to the schematic drawings.

BRIEF DESCRIPTION OF THE DRAWINGS

In the drawings:

FIG. 3a shows a diaphragm with a convex parabola on one side in the movement direction;

FIG. 3b shows a diaphragm with a convex parabola on both sides in the movement direction;

FIG. 3c shows a multiple diaphragm formed of individual diaphragms according to FIG. 3a;

FIG. 6d shows the production of the diaphragm shape according to FIG. 6a;

FIG. 7d shows the production of the diaphragm shape according to FIG. 7a;

DESCRIPTION OF THE PREFERRED EMBODIMENTS

Figure 1:
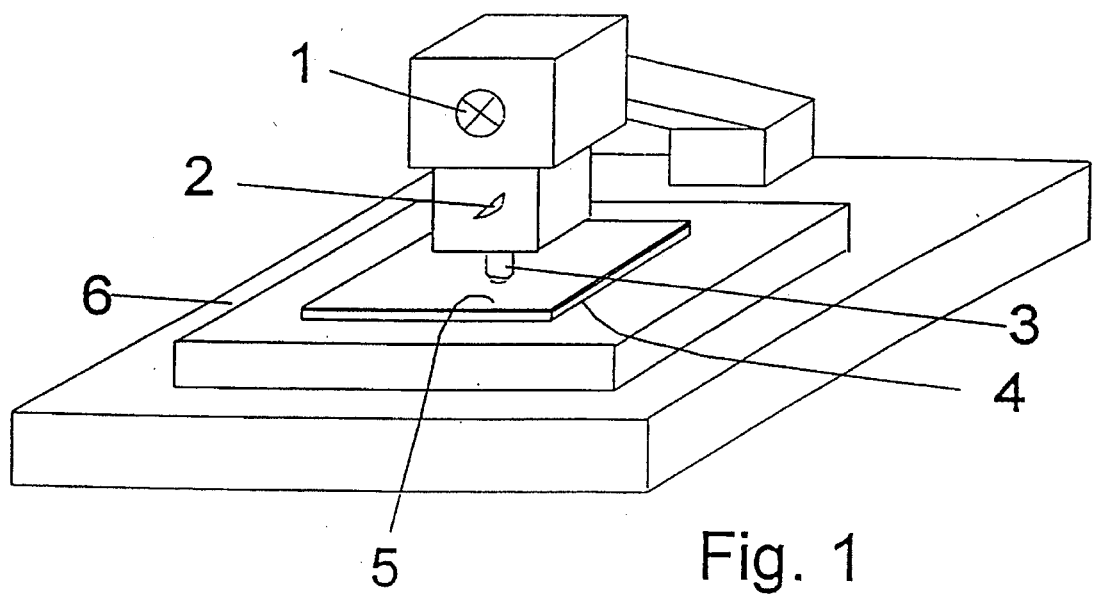
FIG. 1 shows an arrangement, according to the invention, for producing structured surfaces.

The arrangement according to FIG. 1 contains the following components arranged one after the other in the radiating direction: a light source 1 with condenser, as source of radiation; a diaphragm 2 as beam shaping device; an objective 3 as imaging optical system; and an object containing on a substrate 4 a surface in the form of a resist layer 5 which is to be structured. The object is attached to an X-Y positioning table 6. The diaphragms 2 can be permanently installed or exchangeable. An electron source, X-ray source or ion source can also be used as radiation source.

Figure 2:
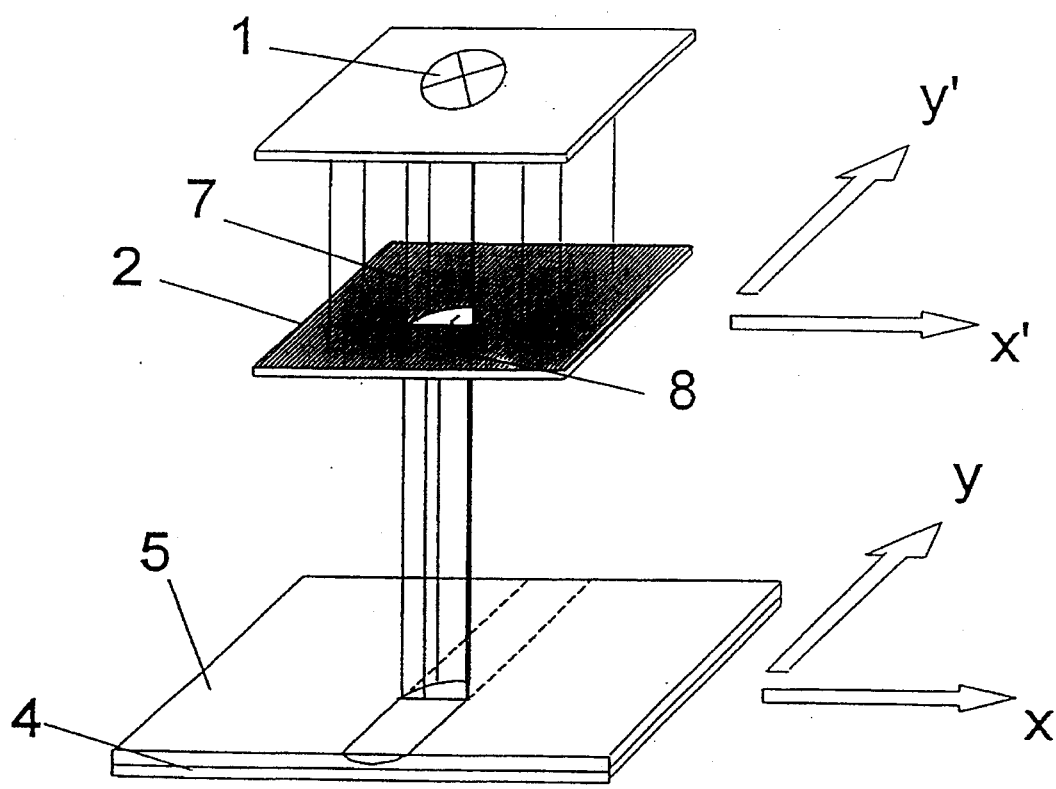
FIG. 2 is a basic diagram for the process according to the invention.

According to FIG. 2, a bundle of light 7 emanating from the light source 1 is so shaped in cross section by the diaphragm 2 that a region 8 is formed separate from the remaining cross section. The shaped region 8 can be moved relative to the surface to be structured by various technical steps familiar to one skilled in the art. For example, the object can be moved by means of the positioning table 6 or the light bundle 7 can be moved jointly with the beam shaping device or both movements can be carried out. It is also possible to produce the relative movement of the region 8 only by linear displacement of the diaphragm 2 or by producing a rotational relative movement around a vertical axis Z—Z directed parallel to the axis of the light bundle 7.

In all constructions the shape of the diaphragm depends upon the direction of the relative movement, since the aperture in the movement direction, together with the velocity of the relative movement, determines the dose to which the object is exposed.

In most cases, the intensity distribution over region 8 is homogeneous. However, for achieving certain results, it is also possible to design the intensity distribution over region 8 with a defined inhomogeneity.

The imaging of the shaped region produced by the imaging optical system may be either sharp or unfocussed. The latter results in more uniform profiles when the blurriness is located in the direction of the relative movement, e.g., by using a cylindrical lens, i.e., requirements for the accuracy of the relative movement decrease. The magnitude of the relative movement can also be reduced by unfocussed imaging. With X rays, in particular, it is also possible to image the region 8 directly by means of shadow projection.

The diaphragm shapes shown in FIGS. 3a to 3b have at least partially parabolic diaphragm apertures 9, 10 allowing light to pass through and shadow regions 11, 12. The diaphragm aperture 9 is enclosed by a rim formed of a straight line $G_1$ and a parabola $P_1$. The parabola $P_1$, whose axis of symmetry $SY_1$ is directed in the movement direction of the relative movement (Y' in the present case), connects two points $S_1$ and $S_2$ on the straight line $G_1$ normal to the movement direction.

The dose which can be achieved with this diaphragm is proportional to the irradiation period t which, in turn, is dependent on the velocity v of the relative movement by which the region of the light beam 7 passing through the diaphragm aperture is moved along the surface to be structured:

$$t(X')=b(X')/v.$$

Quantity b is the aperture of the diaphragm in the movement direction which, in the present example, has the shape of parabola $P_1$. The appropriate aperture of the diaphragm can be selected depending on application.

The aperture b, which is designated by $b_1$ for a location $x_1$, is the second quantity, besides velocity v, determining the dose acting on the surface to be structured during the relative movement along the entire movement path. Proceeding from a maximum dose value in the center of the diaphragm, the dose decreases to zero until the intersection of the parabola $P_1$ with the straight line $G_1$ at intersecting points $S_1$ and $S_2$.

The dose profile which can be achieved with this diaphragm extends in a direction normal to the movement direction along the entire movement path. A uniform and defined structure depth is ensured by temporal and spatial homogeneity of the light beam 7 and a constant velocity v.

The diaphragm shown in FIG. 3b has a rim formed of two parabolas $P_2$ and $P_3$ having a common axis of symmetry $SY_2$ directed in the movement direction. Parabolas $P_2$ and $P_3$ are convex in the direction of movement and in the opposite direction and have common intersecting points $S_3$ and $S_4$ lying on a straight line $G_2$ normal to the movement direction. In the present example, the straight line $G_2$ does not form a rim. As in the preceding construction, the two parabolas $P_2$ and $P_3$ can be asymmetrical but also mirror-symmetrical.

The dose profiles which can be produced by the diaphragm according to FIG. 3b are identical to those formed by applying the diaphragm according to FIG. 3a. The advantage of the two-sided parabola shape consists in that it compensates for inaccuracies, in particular tilting.

The multiple diaphragm shown in FIG. 3c contains individual diaphragms which are arranged one after the other in the movement direction and have diaphragm apertures 14 which correspond in shape to diaphragm aperture 9. In order to produce dose profiles with such multiple diaphragms it is sufficient to carry out the relative movement along a path length determined by the distances between the diaphragm apertures 14. This results in a dose profile corresponding to cylindrical lenses arranged adjacent to one another in a parallel manner. When two exposure processes are carried out in directions at right angles to one another, the dose profile corresponds to a lens array. It is possible to vary the construction of the multiple diaphragms with respect to the arrangement, shape and magnitude of the individual diaphragms.

For example, a multiple diaphragm can be so designed that with dimensions of 50×50 mm, 10,000 individual diaphragms in the shape of diaphragm apertures 14 with dimensions of 500 μm normal to the movement direction and dimensions of a maximum of 250 μm in the movement direction are provided. Exposure can be effected by shadow projection with colliding light. The use of X rays is also advantageous. The solution presents an inexpensive variant for producing giant arrays.

FIGS. 4 to 9 illustrate the results which can be obtained with different diaphragm shapes. Naturally, the invention is not limited to the shapes which are indicated here by way of example.

The figures designated by "a" indicate the diaphragm shape, while those designated by "b" show the results obtained by applying these shapes in the movement direction, and figures designated by "c" show the results obtained in the intersecting region of movement directions at right angles to one another. The diaphragm according to FIG. 4a corresponds to the diaphragm already described in FIG. 3a.

Figure 4A:
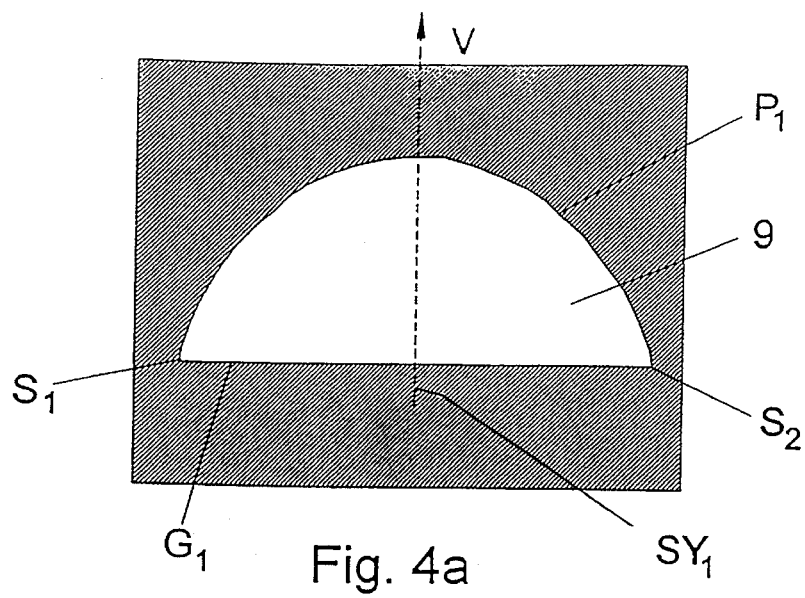
FIGS. 4a–c show parabolic diaphragms and structures produced therewith.
Figure 4B:
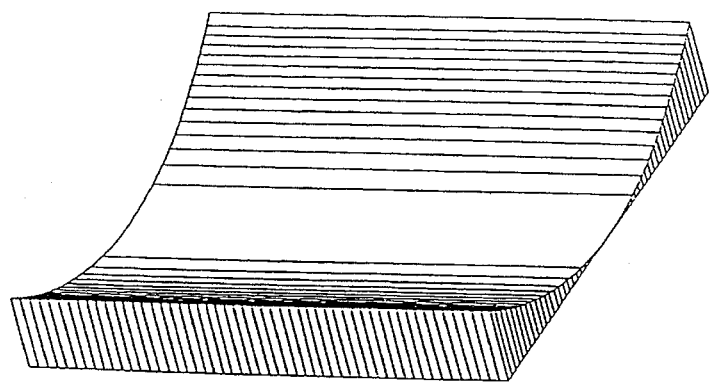

If a positive resist is used for the resist layer 5 as the surface to be structured, a concave cylindrical lens according to FIG. 4b is formed when a region shaped by a parabolic diaphragm according to FIG. 4a is moved relative to the surface and in the direction of the parabola after a corresponding developing process.

Figure 4C:
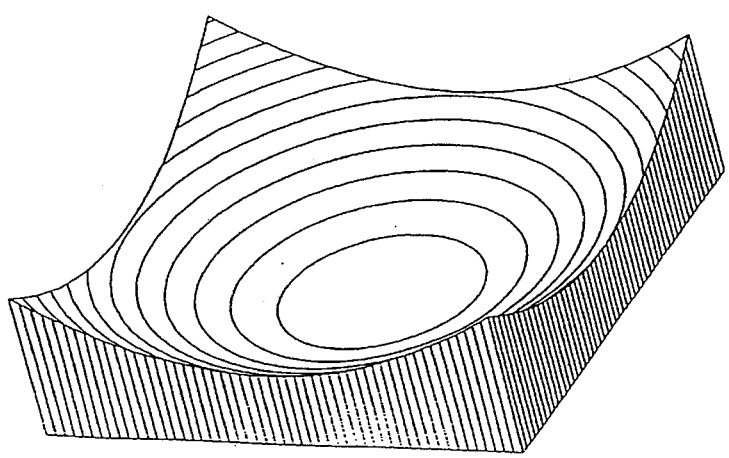

When two exposure processes are carried out in directions oriented at right angles to one another, a radial concave lens can be produced, since a dose distribution corresponding to a lens of this type is produced in the overlapping region of the two exposure processes (FIG. 4c).

Elliptical lenses can also be produced by suitable selection of different diaphragm sizes.

The two exposure processes can also be effected using relative movements in directions which are inclined relative to one another by angles diverging by 90°. This results in "displaced" variations of lenses. The focal lengths of the respective lens or components of the elliptical lens are determined by the velocity of the relative movement.

Figure 5A:
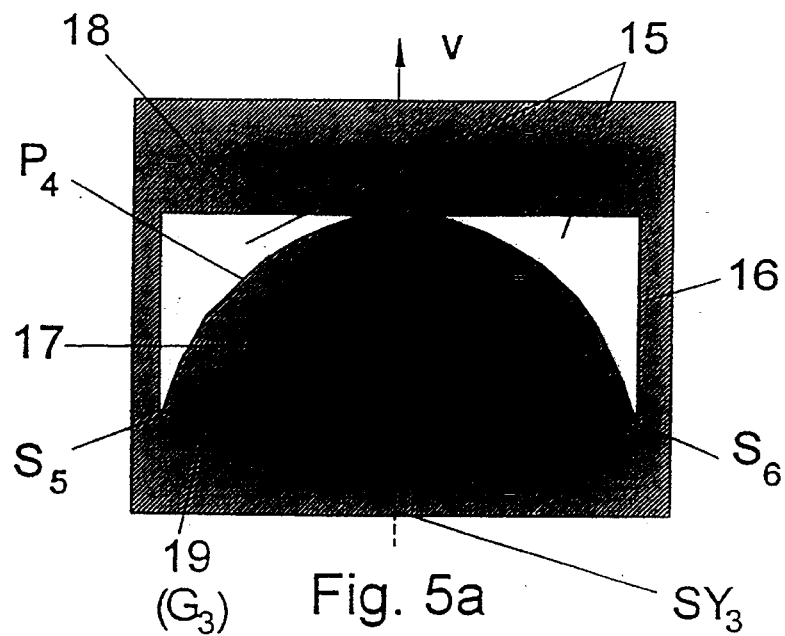
FIGS. 5a–c show parabolic diaphragms and structures produced therewith.
Figure 5B:
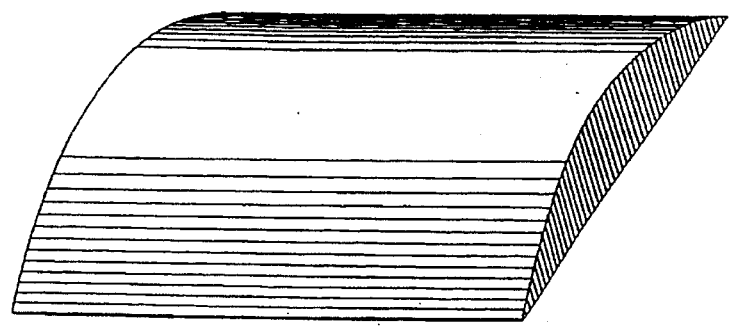
Figure 5C:
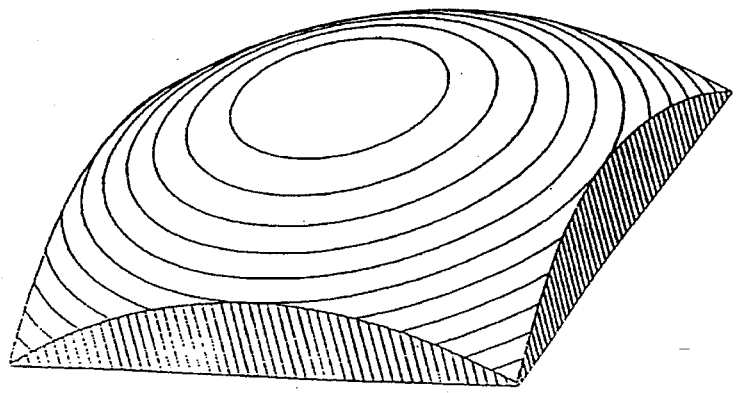

Convex cylindrical lenses according to FIG. 5b and radial convex lenses according to FIG. 5c can be realized with a diaphragm according to FIG. 5a.

The diaphragm according to FIG. 5a has a diaphragm aperture 15 corresponding to a portion which is left open in a rectangular rim 16 by a shadow element 17. Sides 18, 19 of a pair of sides of the rim are directed normal to the movement direction. The side 19 coincides with a straight rim $G_3$ of the shadow element 17, the remaining rim of the shadow element 17 forming a parabola $P_4$ with an axis of symmetry $SY_3$ in the movement direction connecting two points $S_5$ and $S_6$ on the straight rim $G_3$.

Figure 6A:
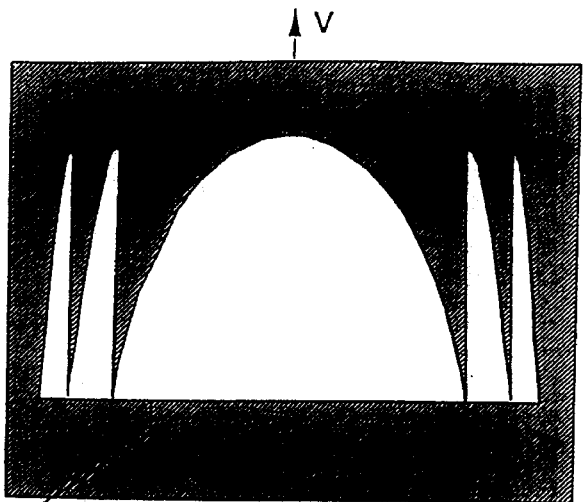
FIGS. 6a–c show a diaphragm shape and Fresnel structures fabricated therewith.
Figure 6B:
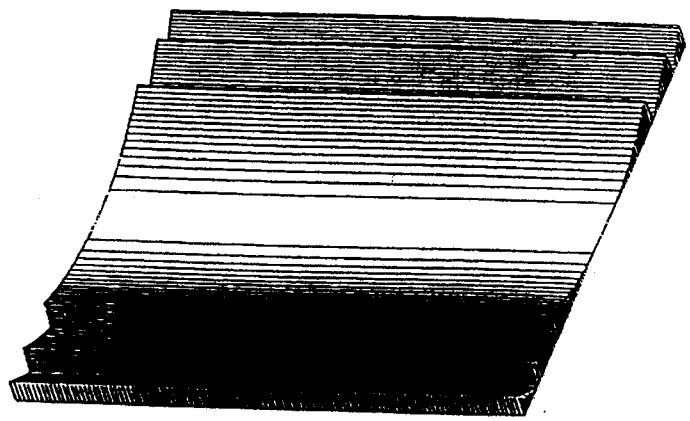
Figure 6C:
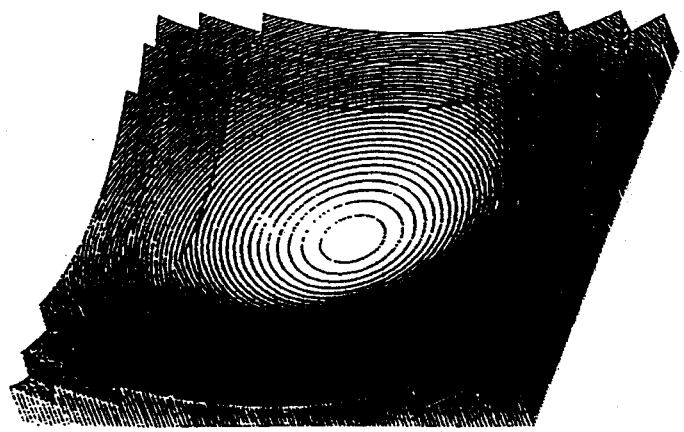

A diaphragm according to FIG. 6a with a diaphragm aperture 20 is used for fabricating Fresnel type lenses. When applied once in one movement direction, a concave cylindrical Fresnel lens results. When two exposure processes are carried out in directions at right angles to one another, a concave Fresnel lens results, whose shape has already been described in German Patent Application P 43 14 574.4.

Figure 6D:
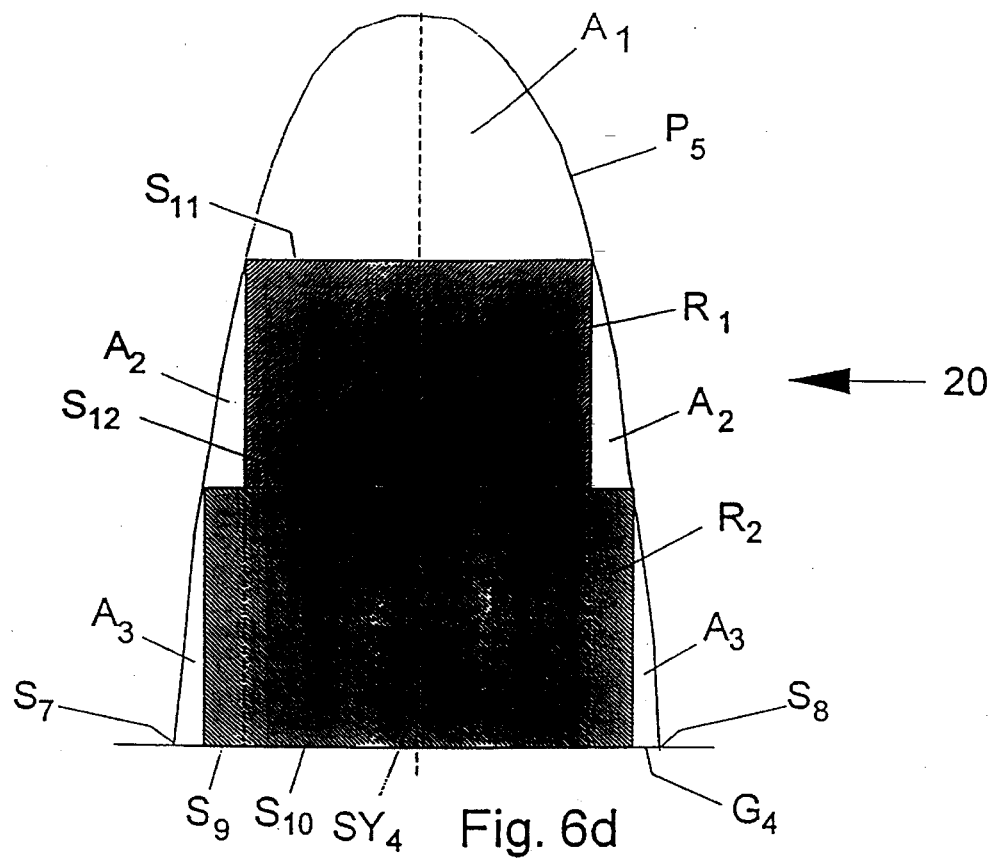

A diaphragm of this type according to FIG. 6a is produced, as shown in FIG. 6d, in such a way that rectangular shadow elements $R_1$, $R_2$ sharing a common side $S_9$, $S_{10}$ with the straight line $G_4$ are inserted in a diaphragm aperture 20' whose rim comprises a straight line $G_4$ and a parabola $P_5$ with intersecting points $S_7$, $S_8$. The sides $S_{11}$, $S_{12}$ located opposite sides $S_9$, $S_{10}$ contact the parabola $P_5$ by their end points, this parabola $P_5$ having an axis of symmetry $SY_4$ which faces in the movement direction. The portions $A_1$, $A_2$, $A_3$ which are left open form the diaphragm aperture 20 in that they are located at a common border $G_5$.

Figure 7D:
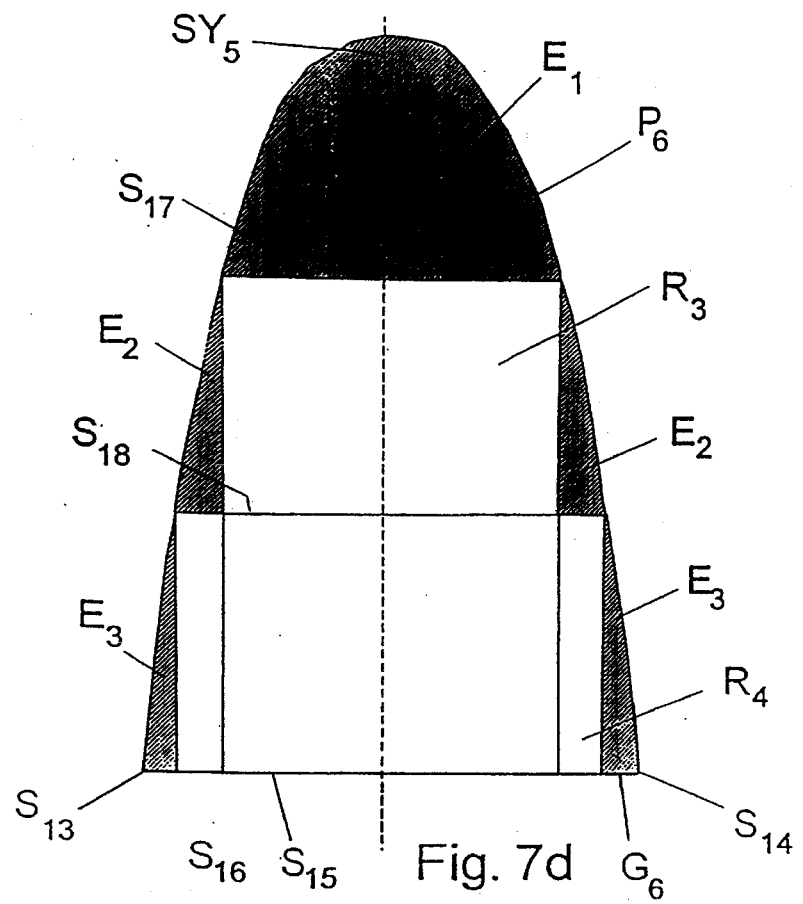
Figure 7A:
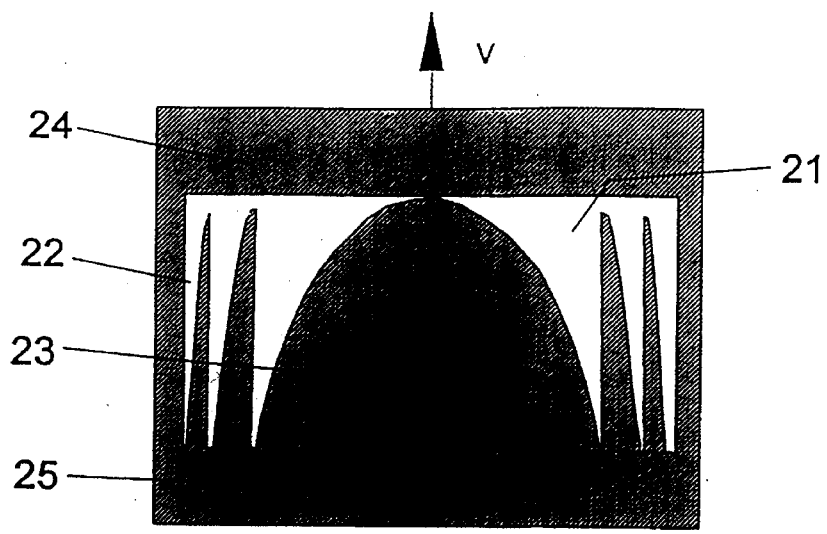
FIGS. 7a–c show a diaphragm shape and Fresnel structures fabricated therewith.
Figure 7B:
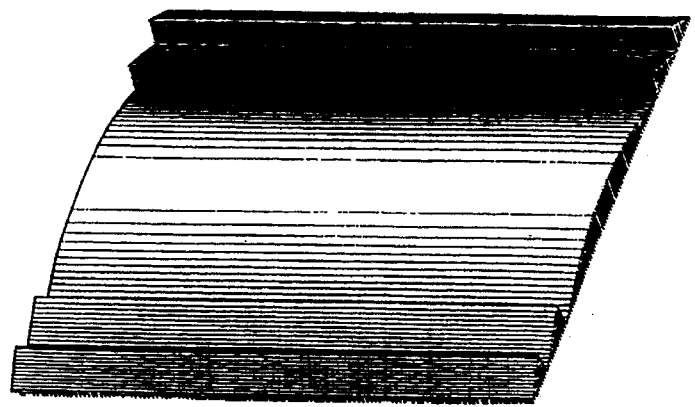
Figure 7C:
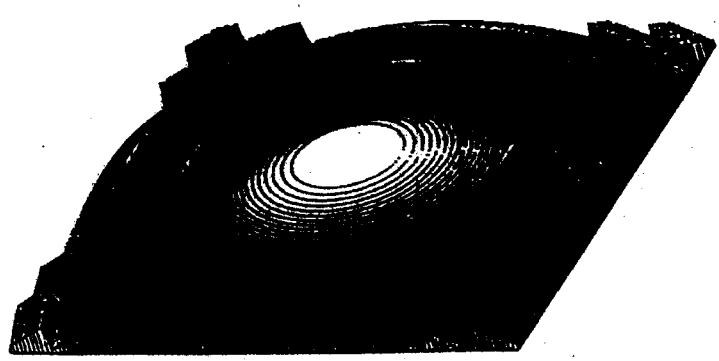
Figure 8A:
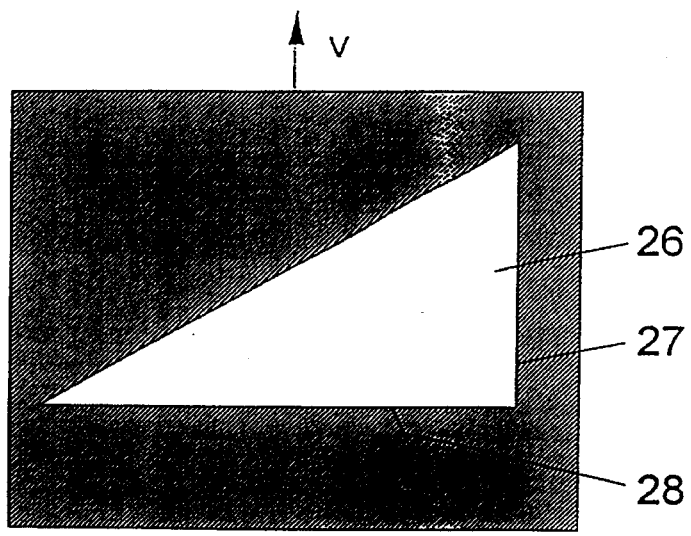
FIGS. 8a–c show a wedge-shaped diaphragm and structures produced therewith.
Figure 8B:
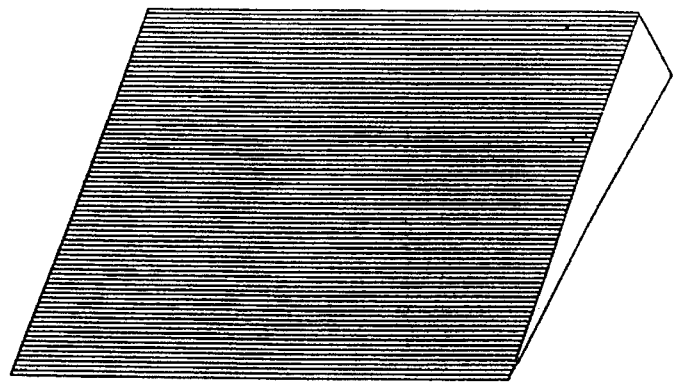
Figure 8C:
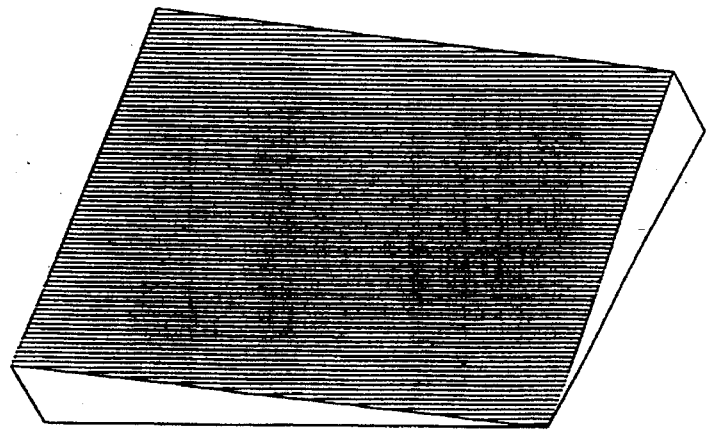

A diaphragm according to FIG. 7a provides convex Fresnel type cylindrical lenses or convex Fresnel lenses. Such lenses have also already been described in German Patent Application P 43 14 574.4.

The diaphragm according to FIG. 7a has a diaphragm aperture 21 formed by a portion left open by a shadow element 23 in a rectangular rim 22, wherein a pair of sides of the rim 22 has sides 24, 25 in an orientation normal to the movement direction.

According to FIG. 7d, the shadow element 23 is formed of partial elements $E_1$, $E_2$, $E_3$ which are left when at least one rectangular portion $R_3$, $R_4$ is removed from a surface enclosed by a straight line $G_6$ and a parabola $P_6$. The parabola $P_6$, whose axis of symmetry $SY_5$ is oriented in the movement direction, connects two points $S_{13}$, $S_{14}$ on the straight line $G_6$ normal to the movement direction. While one side $S_{15}$, $S_{16}$ of the rectangular portions $R_3$, $R_4$ coincides with straight line $G_6$, the opposite sides $S_{17}$, $S_{18}$ contact the parabola $P_6$ with their end points. In FIG. 7a, the partial elements form the diaphragm aperture 21 in that they are situated at side 25. It is also possible to use the other side 24 for contact.

Another suitable diaphragm (FIG. 8a) can have a diaphragm aperture in the shape of a right triangle 26, one of whose legs 27, 28 is directed in the movement direction.

Figure 9A:
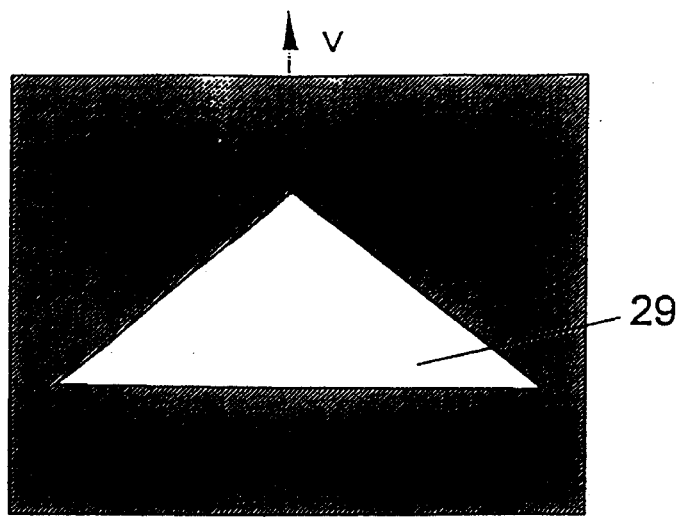
FIGS. 9a–c show a triangular diaphragm and structures produced therewith.
Figure 9B:
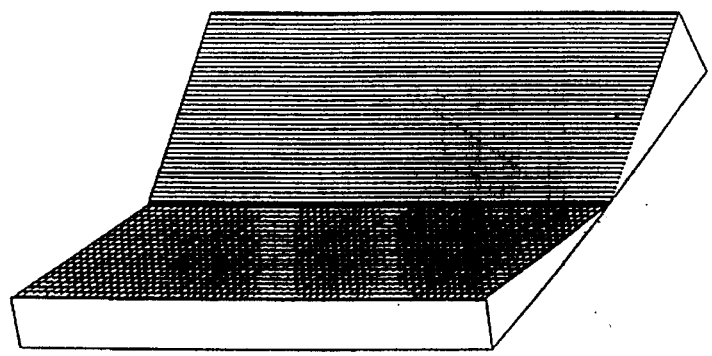
Figure 9C:
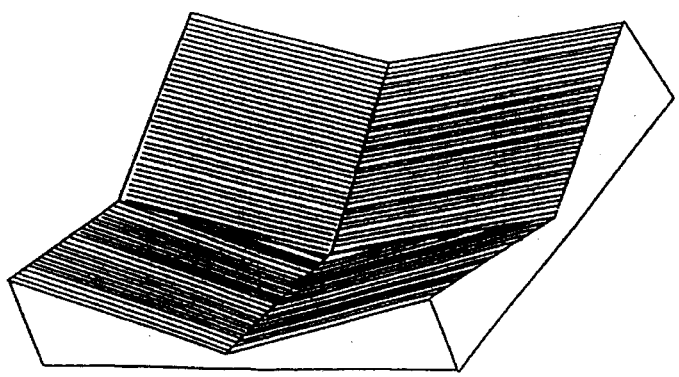

FIG. 9a shows a diaphragm aperture 29 in the shape of an isosceles triangle whose vertex formed by the equal sides is directed in the movement direction. Diaphragm aperture 26 results in corresponding wedge profiles, aperture 29 results in triangular and pyramidal profiles.

Figure 10A:
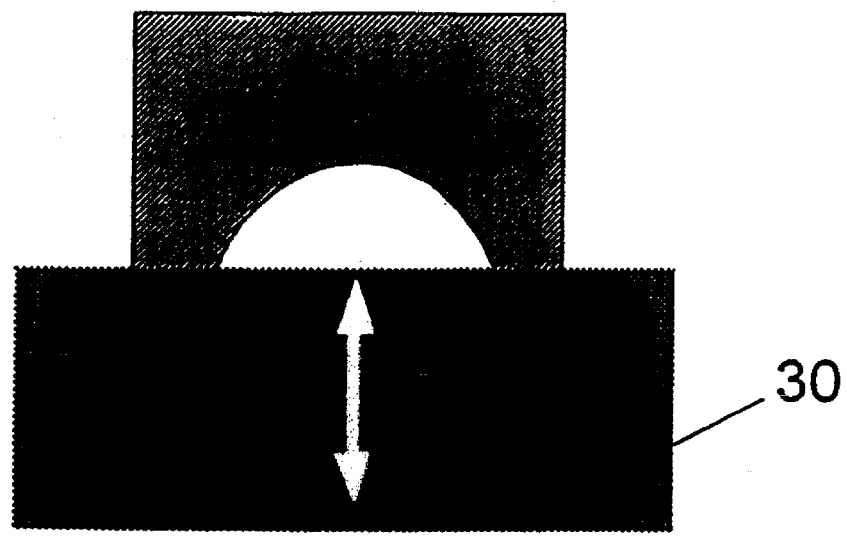
FIGS. 10a, b show diaphragms with variable geometry.
Figure 10B:
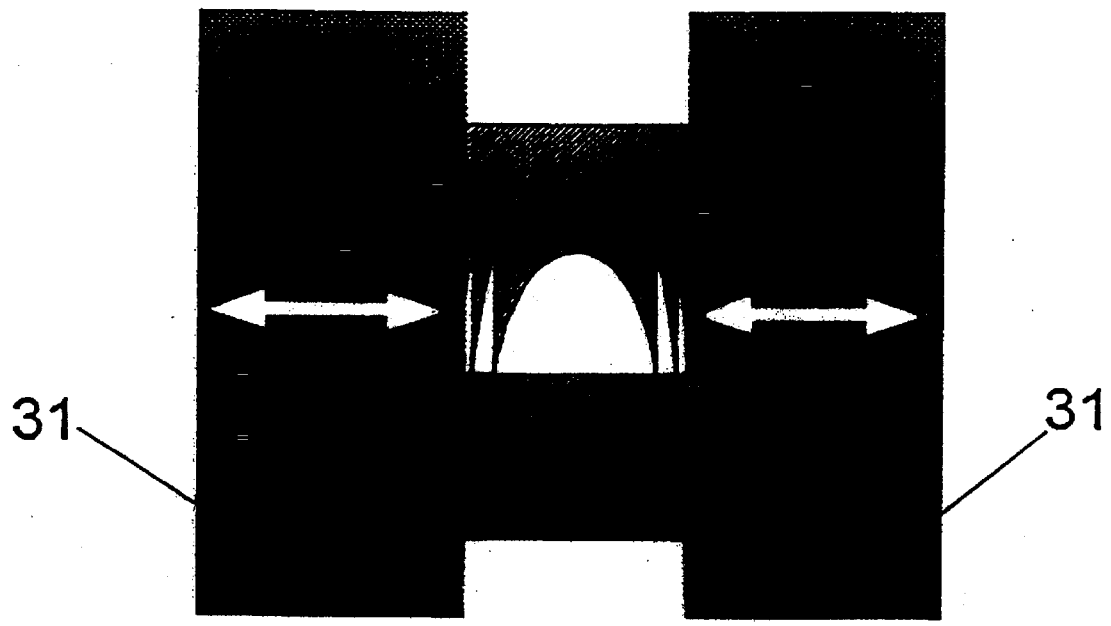

The diaphragms shown in FIGS. 10a and 10b are provided with adjusting slides 30 and 31 by means of which the diaphragm can be adjusted. The base width can be changed by adjusting slide 30, while the structure width can be changed by adjusting slide 31. Accordingly, lenses of varying geometry with respect to size can be produced in a simple manner. Adjustment can be automated and can also be effected during an exposure process in order to vary the structure widths.

Figure 11:
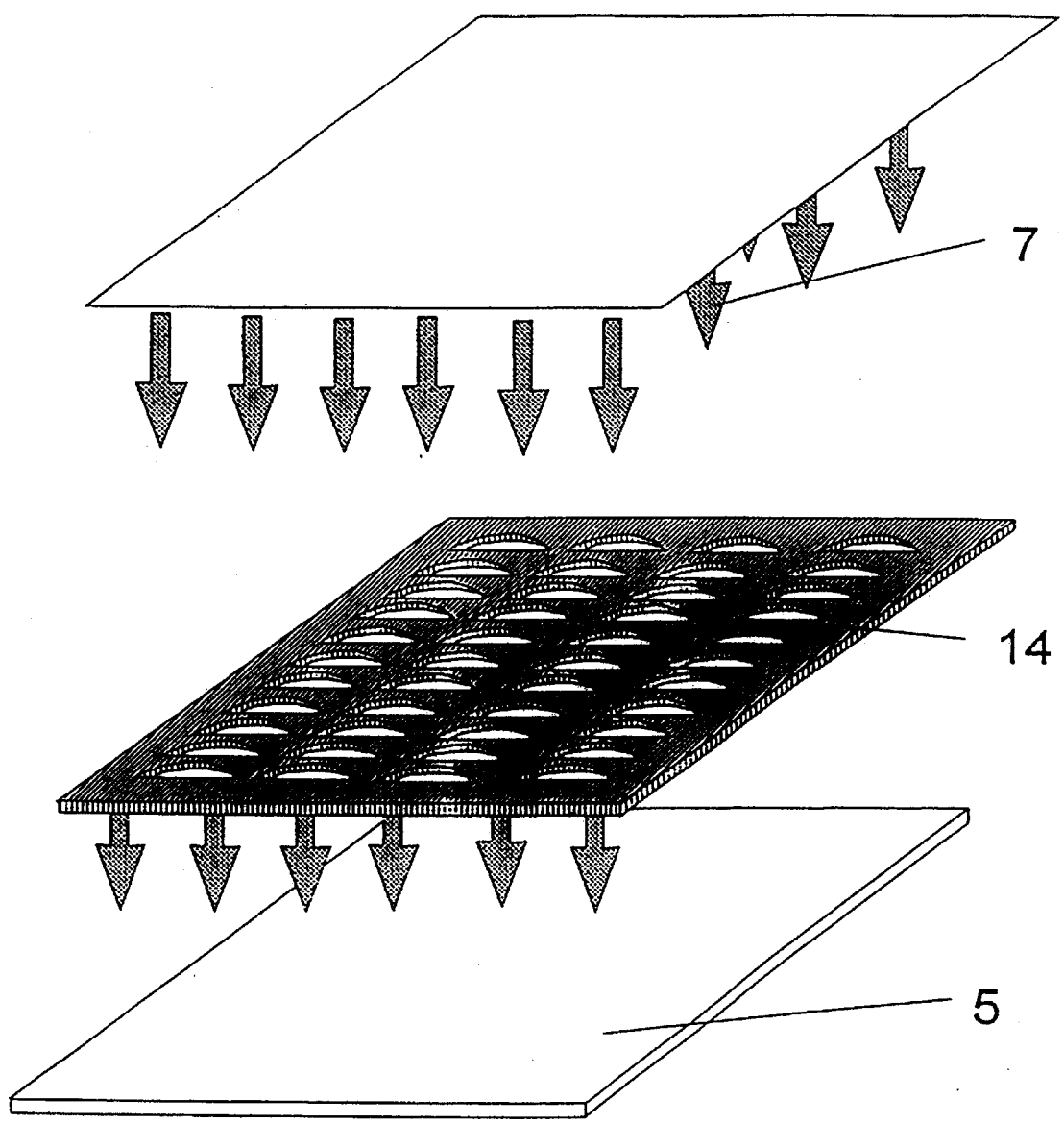
FIG. 11 shows a schematic arrangement for parallel production of structured surfaces.

FIG. 11 illustrates the use of a multiple diaphragm as a beam shaping device. This solution corresponds to that shown in FIG. 2 with respect to function. Piezo-actuators (not shown) which are coupled to the diaphragm and produce easily controllable movements, e.g., in the form of oscillations, are suitable for carrying out the relative movement of the multiple diaphragm.

Figure 12:
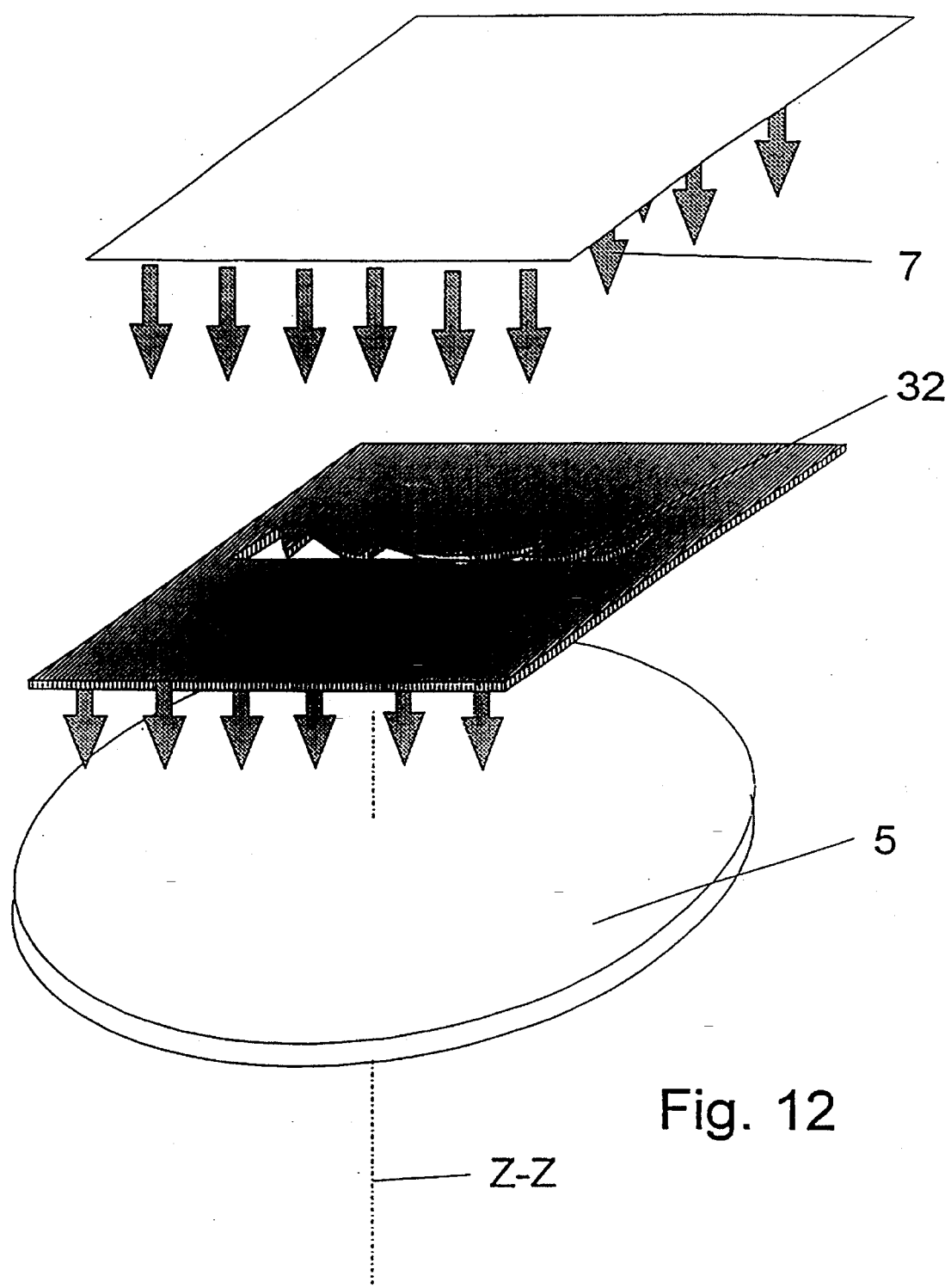
FIG. 12 shows a schematic arrangement for the fabrication of round Fresnel lenses.
Figure 13:
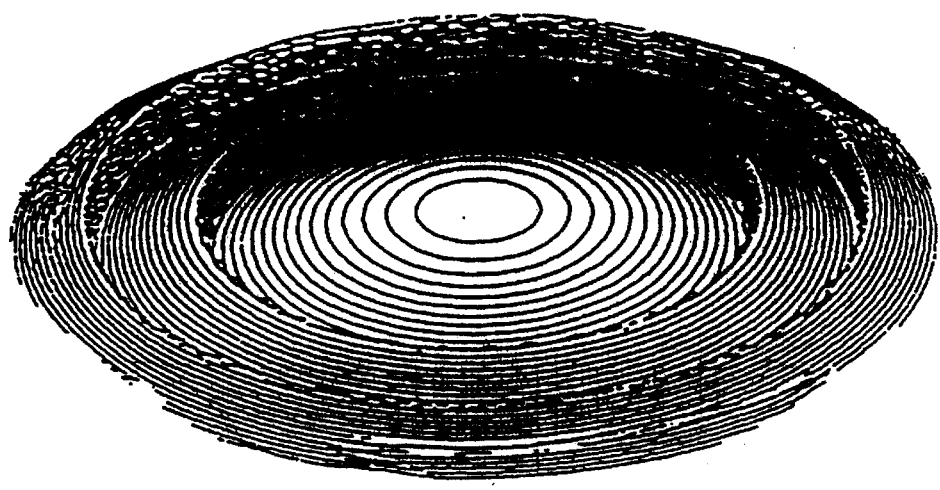
FIG. 13 shows a section from a round Fresnel lens.

Dose profiles corresponding to round Fresnel lenses can be produced with the arrangement which is shown schematically in FIG. 12. The diaphragm has a corresponding diaphragm aperture 32. This solution corresponds to that shown in FIG. 2 with respect to function, with the difference that the relative movement is produced by a rotational movement around axis Z—Z. FIG. 13 shows a round Fresnel lens produced in this way.

Figure 14:
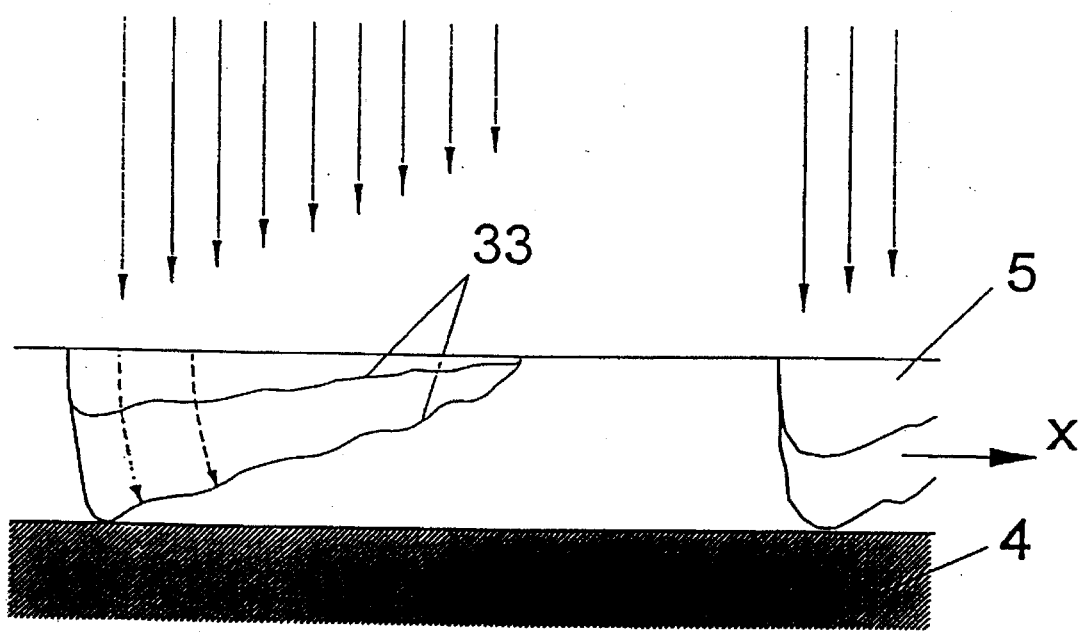
FIG. 14 shows the basic procedure in the production of surface profiles with variable doses.

FIG. 14 illustrates the basic procedure for producing surface profiles with variable doses and thus shows an application for dose values which can be realized with the invention. While the resist layer 5 is being developed, a different irradiation intensity in the X-direction causes a development front 33 which progresses with the duration of development and produces a surface profile in the resist.

Other applications are provided for radiation-sensitive objects in which the surface profile is developed into the object. Direct profiling of the object can also be effected by means of profile etching in that the radiation works the structure into the material directly, e.g., as in ion-beam etching.

Figure 15A:
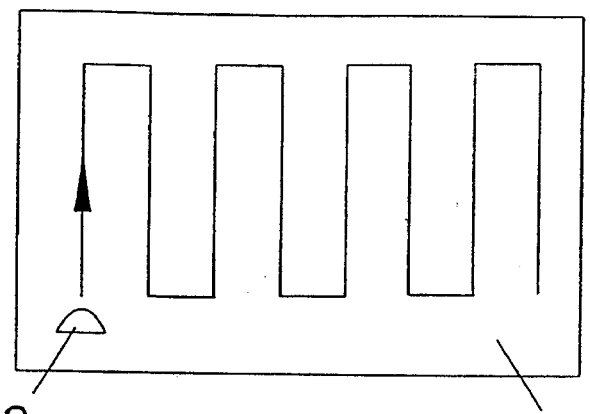
FIGS. 15a, b show a simple meandering movement and structures which can be produced therewith.
Figure 15B:
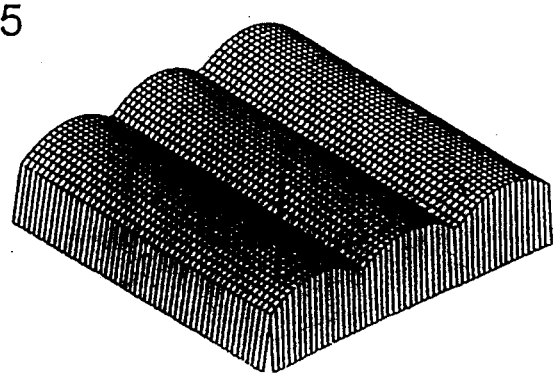
Figure 16A:
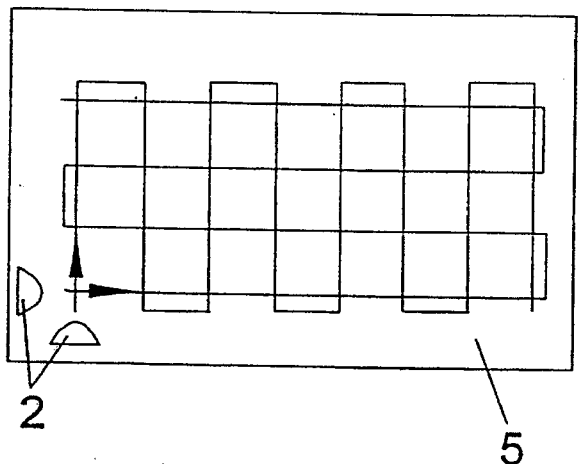
FIGS. 16a, b show an intersecting meandering movement and structures which can be produced therewith.
Figure 16B:
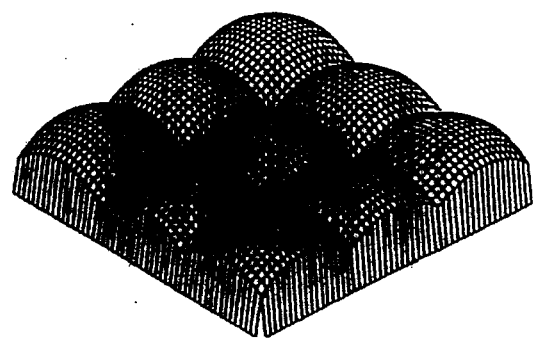

Cylindrical-lens arrays and lens arrays (FIG. 15b and FIG. 16b) can be produced by the procedures of meandering exposure, as indicated by the arrows, shown in FIGS. 15 and 16.

While the foregoing description and drawings represent the preferred embodiments of the present invention, it will be obvious to those skilled in the art that various changes and modifications may be made therein without departing from the true spirit and scope of the present invention.

What is claimed is:

1. In an arrangement for producing dose profiles for the fabrication of microlens arrays with a beam used for exposure and directed on a surface of a substrate, the improvement comprising:

shaping means including a diaphragm assembly having a plurality of apertures for shaping the cross-section of a plurality of exposure beams, which shaping means generates a plurality of shaped beam cross-sections which are fixed relative to one another and movable relative to the surface and whose extents in the direction of the relative movement, in combination with the velocity of the relative movement, determines doses for a plurality of respective areas on said substrate, said apertures being arranged one behind the other in the direction of relative movement.

2. The optical arrangement according to claim 1, wherein piezo-actuators are connected with the diaphragm assembly to produce the relative movement.

3. The optical arrangement according to claim 2, wherein the relative movement corresponds to a distance between adjacent apertures of said diaphragm assembly in the movement direction.

4. The optical arrangement according to claim 1, wherein at least one of the diaphragm apertures has a rim formed of a straight line and a parabola, said parabola having an axis of symmetry directed in the movement direction, which connects two points on a straight line normal to the movement direction.

5. The optical arrangement according to claim 4, wherein at least one rectangular shadow element is placed in said one of the diaphragm apertures, one side of the rectangular shadow element coinciding with the straight line and the opposite side contacting the parabola by its end points.

6. The optical arrangement according to claim 5, wherein the regions left open by the shadow element are situated at a common border by their edges which are in an orientation normal to the movement direction.

7. The optical arrangement according to claim 1, wherein at least one of said diaphragm apertures has a rim formed of two parabolas, wherein the parabolas, which have a common axis of symmetry oriented in the movement direction, are constructed so as to be convex in the movement direction and opposite thereto and have common intersection points lying on a straight line normal to the movement direction.

8. The optical arrangement according to claim 1, wherein at least one of the diaphragm apertures is a portion left open within a rectangular rim by a shadow element and wherein a pair of rim sides has sides extending in a direction normal to the movement direction.

9. The optical arrangement according to claim 8, wherein one of the sides normal to the movement direction coincides with a straight rim of the shadow element, whose other rim is a parabola whose axis of symmetry in the movement direction connects two points on the straight rim.

10. The optical arrangement according to claim 8, wherein the shadow element is formed of partial elements remaining after at least one rectangular portion is removed from a surface enclosed by a straight line and a parabola, wherein the parabola, whose axis of symmetry is oriented in the movement direction, connects two points on the straight line normal to the movement direction, one side of the rectangular portion coincides with the straight line, while the end points of the opposite side contact the parabola, and in that the partial elements are so disposed that their straight rims normal to the movement direction are located at one of the sides of the rectangular rim which are normal to the movement direction.

11. The optical arrangement according to claim 1, wherein at least one of the apertures of the diaphragm assembly corresponds to a right triangle, one of whose legs is directed in the movement direction.

12. The optical arrangement according to claim 1, wherein at least one of the apertures of the diaphragm assembly corresponds to an isosceles triangle whose vertex is formed by the equal sides is directed in the movement direction.

13. The optical arrangement according to claim 1 wherein adjusting slides are provided for adjusting the shape or magnitude of the diaphragm assembly.

14. The optical arrangement according to claim 1, wherein a display screen is used for shaping the cross sections of the beams.

* * * * *